(12) United States Patent
Terao et al.

(10) Patent No.: US 11,824,551 B2
(45) Date of Patent: Nov. 21, 2023

(54) TRACK-AND-HOLD CIRCUIT

(71) Applicant: Nippon Telegraph and Telephone Corporation, Tokyo (JP)

(72) Inventors: Naoki Terao, Tokyo (JP); Munehiko Nagatani, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 17/916,956

(22) PCT Filed: Apr. 7, 2020

(86) PCT No.: PCT/JP2020/015636
§ 371 (c)(1),
(2) Date: Oct. 4, 2022

(87) PCT Pub. No.: WO2021/205531
PCT Pub. Date: Oct. 14, 2021

(65) Prior Publication Data
US 2023/0155600 A1    May 18, 2023

(51) Int. Cl.
| | |
|---|---|
| *H03M 1/00* | (2006.01) |
| *H03M 1/12* | (2006.01) |
| *G11C 27/02* | (2006.01) |
| *H03K 5/003* | (2006.01) |
| *H03K 5/24* | (2006.01) |
| *H03K 17/60* | (2006.01) |

(52) U.S. Cl.
CPC ............. *H03M 1/124* (2013.01); *G11C 27/02* (2013.01); *H03K 5/003* (2013.01); *H03K 5/24* (2013.01); *H03K 17/60* (2013.01)

(58) Field of Classification Search
CPC ........ H03M 1/00; H03M 1/001; H03M 1/124; H03M 1/1245; G11C 27/02; G11C 27/024
USPC ..................................... 327/91, 94
See application file for complete search history.

(56) References Cited

U.S. PATENT DOCUMENTS 11,362,669 B2 *  6/2022  Fukuyama ......... H03F 3/45085

FOREIGN PATENT DOCUMENTS

JP    2019161324 A    9/2019

* cited by examiner

*Primary Examiner* — Hai L Nguyen
(74) *Attorney, Agent, or Firm* — Slater Matsil, LLP

(57) ABSTRACT

Bias adjusting circuits (1_(2k-1), 1_2k) (where k is an integer equal to or greater than 1 and equal to or less than N, and N is an integer equal to or more than 2) adjust DC bias voltage of at least one of clock signals such that a duty ratio, which is a ratio between a period in which a clock signal is High as to a clock signal and a period in which the clock signal is Low thereasto, becomes (2N−2k+1):(2k−1). Sampling circuits switch between a track mode in which an output signal tracks an input signal, and a hold mode in which a value of the input signal at a timing of switching from the track mode to the hold mode is held and output, in accordance with clock signals output from the bias adjusting circuits (2_1 to 2_2N).

11 Claims, 24 Drawing Sheets

TRACK-AND-HOLD CIRCUIT

CROSS-REFERENCE TO RELATED APPLICATIONS

This application is a national phase entry of PCT Application No. PCT/JP2020/015636, filed on Apr. 7, 2020, which application is hereby incorporated herein by reference.

TECHNICAL FIELD

The present invention relates to a semiconductor integrated circuit, and more particularly relates to a track-and-hold circuit used in a frontend of an A/D converter that converts analog signals into digital signals.

BACKGROUND

An A/D converter is a circuit that converts analog signals into digital signals, and is an important elemental circuit in equipment used in wired communication, wireless communication, and measurement technology, in which speeds have been increasing in recent years. There are a wide variety of types of methods of configuring A/D converters, and a typical arrangement includes a track-and-hold circuit wo and a quantizer 101, as shown in FIG. 16.

The track-and-hold circuit wo acquires (samples) an analog signal Vin at temporally equidistant timings synchronized with a clock signal, and holds for a predetermined period. The quantizer 101 converts the input value to a digital signal Dout made up of one or a plurality of bits while the track-and-hold circuit wo holds the input value.

Operations of the track-and-hold circuit wo will be described with reference to FIGS. 17A to 17C. The simplest operation model of the track-and-hold circuit wo is made up of an analog switch 103 and a capacitor 104. Sine waves having a constant frequency are normally used for the clock signal ck, and accordingly description will proceed below assuming sine waves. The analog switch 103 switches between two states of a track mode Mt in which input is transmitted to output without change, and a hold mode Mh in which the input and the output are electrically cut off, in accordance with High/Low of the clock signal ck. The capacitor 104 is used to hold the voltage of an output signal Vout, cut off from input when in the hold mode, at a constant value.

The relation between the clock signal ck and the mode of the track-and-hold circuit wo may be optionally decided, but in the example of FIGS. 17A to 17C, an example is described in which the track mode Mt is set when the clock signal ck is High, and the hold mode Mh is set when the clock signal ck is Low.

When the clock signal ck is High, i.e., during the track mode Mt, the switch 103 turns on as illustrated in FIG. 17B, and the output signal Vout tracks the input signal Vin. At the instant of the clock signal ck going from High to Low (the instant of transitioning from the track mode Mt to the hold mode Mh), the switch 103 turns off as illustrated in FIG. 17C, and the voltage value of the input signal Vin at that instant is held in the capacitor 104 during the hold mode Mh period. At the instant that the clock signal ck goes to High again, the output signal Vout is reset and resumes tracking the input signals Vin.

The track-and-hold circuit wo samples the input signal Vin at the instant of the falling edge (transition from High to Low) of the clock signal ck. A track-and-hold circuit wo that has such a form is referred to as a negative edge trigger type. Conversely, the form of a track-and-hold circuit in which the input signal Vin is sampled at the instant of the rising edge (transition from Low to High) of the clock signal ck is referred to as a positive edge trigger type. Also, the ratio of High and Low periods of the clock signal ck is referred to as the duty ratio. If the clock signal ck is a sine wave, the duty ratio is 1:1.

The number of times that the track-and-hold circuit samples the input signal Vin per unit time will be referred to as sampling frequency. In the track-and-hold circuit illustrated in FIGS. 17A to 17C, the instant of holding data occurs once per clock cycle, and accordingly the sampling frequency and the clock frequency are in an equal relation. Raising the clock frequency improves resolution of the A/D converter in the temporal direction, and faster input signals can be handled. However, in a case in which the sampling frequency and the clock frequency are equal, there is a problem in that the level demanded regarding the circuit design of a clock generating circuit, a clock transmitting circuit, a clock buffer, and the track-and-hold circuit becomes strict. There also is a problem that electric power consumption increases, and timing margin decreases.

Accordingly, technology has been proposed in which sampling is performed at twice the clock frequency, by using differential clocks, and a sampling circuit that handles the differential clocks (see PTL 1). The track-and-hold circuit disclosed in PTL 1 will be described with reference to FIG. 18. In the example in FIG. 18, an input signal da is branched into two, which are respectively input to separate sampling circuits 200_1 and 200_2. Also, differential clock signals ckp and ckn are input to the sampling circuits 200_1 and 200_2. With the clock signal ckn of a negative phase side as a reference, the relative High/Low of voltage of a positive-phase side clock signal ckp corresponds to the High/Low of the clock signal ck in FIGS. 17A to 17C.

The sampling circuits 200_1 and 200_2 determine the High/Low of the clock signal by the relative High/Low of voltage input to a positive-phase clock input terminal INckp, with voltage input to a negative-phase clock input terminal INckn as a reference.

At the sampling circuit 200_1, the positive-phase clock signal ckp is input to the positive-phase clock input terminal INckp, and the negative-phase clock signal ckn is input to the negative-phase clock input terminal INckn. Meanwhile, at the sampling circuit 200_2, the positive-phase clock signal ckp is input to the negative-phase clock input terminal INckn, and the negative-phase clock signal ckn is input to the positive-phase clock input terminal INckp. That is to say, the High/Low of the clock signals that the sampling circuit 200_2 determines is reverse from the High/Low of the clock signals that the sampling circuit 200_1 determines.

This is to say that the sampling circuit 200_1 is a negative edge trigger type that samples the input signal da at the instant of the falling edge of the clock signal. The sampling circuit 200_2 is a positive edge trigger type that samples the input signal da at the instant of the rising edge of the clock signal. Accordingly, the track-and-hold circuit as a whole in FIG. 18 samples the input signal da at both the rising edge and the falling edge of the clock signal, and accordingly the sampling frequency is twice the clock frequency, and high speed can be realized.

A track-and-hold circuit that has a faster sampling frequency is indispensable in order to handle acceleration of data rates demanded of communication and measurement in recent years. However, even using the technology disclosed in the cited document 1 only yields a sampling frequency that is twice the frequency of the given clock signal. Obtaining a higher sampling frequency necessitates raising the clock frequency, causing the same problem as described above.

CITATION LIST

Patent Literature

[PTL 1] Japanese Patent Application Publication No. 2019-161324.

SUMMARY

Technical Problem

Embodiments of the present invention has been made to solve the above-described problem, and it is an object thereof to provide a track-and-hold circuit that is capable of performing sampling operations at a sampling frequency four times the clock frequency or more.

Means for Solving the Problem

The track-and-hold circuit according to embodiments of the present invention includes: 2N (where N is an integer equal to or more than 2) bias adjusting circuits configured to adjust a DC bias voltage of differential clock signals; and 2N sampling circuits, configured to switch between a track mode in which an output signal tracks an input signal, and a hold mode in which a value of the input signal at a timing of switching from the track mode to the hold mode is held and output, in accordance with differential clock signals output from the bias adjusting circuits. The (2k−1)th (where k is an integer equal to or greater than 1 and equal to or less than N) bias adjusting circuit and the 2kth bias adjusting circuit adjust the DC bias voltage of at least one of externally input differential clock signals and output the differential clock signals such that a duty ratio, which is a ratio between a period in which a kth positive-phase clock signal is High as to a kth negative-phase clock signal and a period in which the kth positive-phase clock signal is Low thereasto, becomes (2N−2k+1):(2k−1). The kth positive-phase clock signal is input to a positive-phase clock input terminal of the (2k−1)th sampling circuit and a negative-phase clock input terminal of the 2kth sampling circuit, and the kth negative-phase clock signal is input to a negative-phase clock input terminal of the (2k−1)th sampling circuit and a positive-phase clock input terminal of the 2kth sampling circuit.

Also, the track-and-hold circuit according to embodiments of the present invention includes: N (where N is an integer equal to or more than 2) bias adjusting circuits configured to adjust a DC bias voltage of a clock signal; and 2N sampling circuits, configured to switch between a track mode in which an output signal tracks an input signal, and a hold mode in which a value of the input signal at a timing of switching from the track mode to the hold mode is held and output, in accordance with a clock signal and externally input DC voltage output from the bias adjusting circuits. A kth (where k is an integer equal to or greater than 1 and equal to or less than N) bias adjusting circuit adjusts DC bias voltage of an externally input clock signal and outputs clock signal the such that a duty ratio, which is a ratio between a period in which a kth clock signal is High as to a kth DC voltage and a period in which the kth clock signal is Low thereasto, becomes (2N−2k+1):(2k−1). The kth clock signal is input to a positive-phase clock input terminal of the (2k−1)th sampling circuit and a negative-phase clock input terminal of the 2kth sampling circuit, and the kth DC voltage is input to a negative-phase clock input terminal of the (2k−1)th sampling circuit and a positive-phase clock input terminal of the 2kth sampling circuit.

Effects of embodiments of the Invention

According to embodiments of the present invention, sampling can be performed at a high frequency, which is four times the clock frequency or more. Also, for a sampling frequency the same as with the conventional, using embodiments of the present invention enables a slow clock signal having a frequency that is ¼ the sampling frequency or lower to be used, and the level demanded regarding the circuit design of a clock generating circuit, a clock transmitting circuit, a clock buffer, and a track-and-hold circuit can be relaxed. Also, for a sampling frequency the same as with the conventional, electric power consumption can be reduced, and the timing margin can be increased.

DETAILED DESCRIPTION OF ILLUSTRATIVE EMBODIMENTS

First Embodiment

Figure 1:
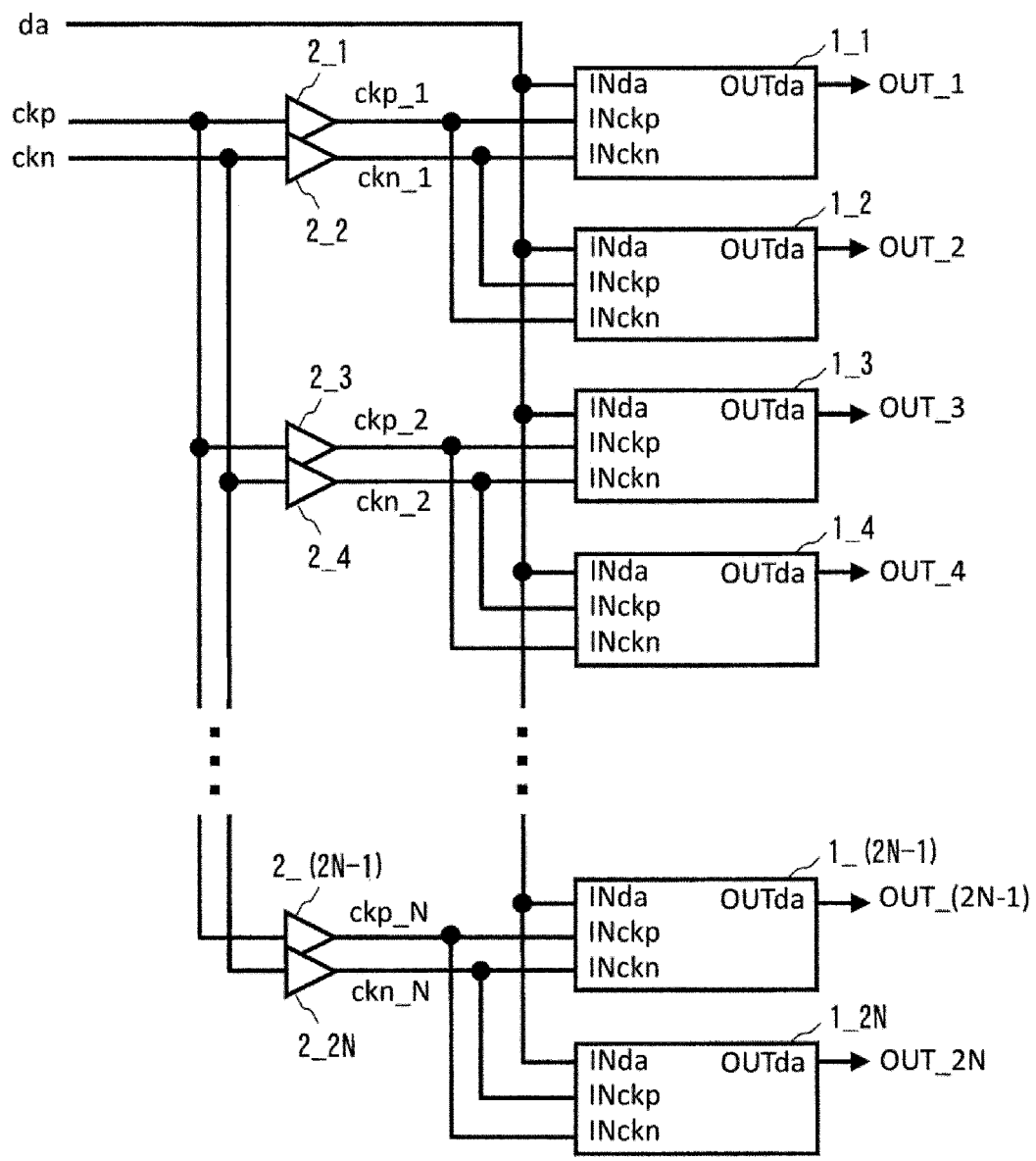
FIG. 1 is a block diagram illustrating a configuration of a track-and-hold circuit according to a first embodiment of the present invention.

Embodiments of the present invention will be described below with reference to the Figures. FIG. 1 is a block diagram illustrating a configuration of a track-and-hold circuit according to a first embodiment of the present invention. The track-and-hold circuit according to the present embodiment is provided with 2N (where N is an integer equal to or more than 2) sampling circuits 1_1 to 1_2N that switch between a track mode in which an output signal tracks an input signal, and a hold mode in which the value of an input signal da at the timing of switching from the track mode to a hold mode is held and output, in accordance with differential clock signals, and 2N bias adjusting circuits 2_1 to 2_2N that adjust DC bias voltage of differential clock signals input to the sampling circuits 1_1 to 1_2N.

First, a positive-phase clock signal ckp is input to the N bias adjusting circuits 2_1, 2_3, . . . , 2_(2N-1) on a positive-phase side. A negative-phase clock signal ckn is input to the N bias adjusting circuits 2_2, 2_4, . . . , 2_2N on a negative-phase side. The (2k−1)th (where k is an integer equal to or greater than 1 and equal to or less than N) bias adjusting circuit 2_(2k−1) and the 2kth bias adjusting circuit 2_2k raise or lower and output the DC bias voltage of at least one of the input differential clock signals ckp and ckn so that the duty ratio, which is the ratio between a period in which the kth positive-phase clock signal ckp_k is High as to the kth negative-phase clock signal ckn-k and a period in which the kth positive-phase clock signal ckp_k is Low thereasto, becomes (2N-2k+1):(2k−1).

The positive-phase clock signal ckp_k is input to a positive-phase clock input terminal INckp of the (2k−1)th sampling circuit 1_(2k−1), and the negative-phase clock signal ckn_k is input to a negative-phase clock input terminal INckn of the sampling circuit 1_(2k−1). Simultaneously with this, the positive-phase clock signal ckp_k is input to the negative-phase clock input terminal INckn of the 2kth sampling circuit 1_2k, and the negative-phase clock signal ckn_k is input to the positive-phase clock input terminal INckp of the sampling circuit 1_2k.

According to the above, the sampling circuits 1_1 to 1_2N as a whole can realize a sampling frequency of (2×N) times that of the clock frequency.

As described above, the duty ratio of the clock signals ckp_k and ckn_k is (2N-2k+1):(2k−1). Such duty ratio adjustment can be realized by adjusting the relative positional relation between the clock signals ckp_k and ckn_k. There are several methods for the adjustment method, as in (I) to (III), for example.

(I) Outputting the positive-phase clock signal ckp as ckp_k without change (no change in DC bias voltage), and outputting the negative-phase clock signal ckn with the DC bias voltage raised or lowered as ckn_k.

(II) Outputting the positive-phase clock signal ckp with the DC bias voltage raised or lowered as ckp_k, and outputting the negative-phase clock signal ckn as ckn_k without change.

(III) Outputting the positive-phase clock signal ckp with the DC bias voltage raised or lowered as ckp_k, and outputting the negative-phase clock signal ckn with the DC bias voltage raised or lowered as ckn_k.

Any one of (I) to (III) may be used for the adjusting method. The adjusting method is the same for all of the embodiments below.

Figure 2:
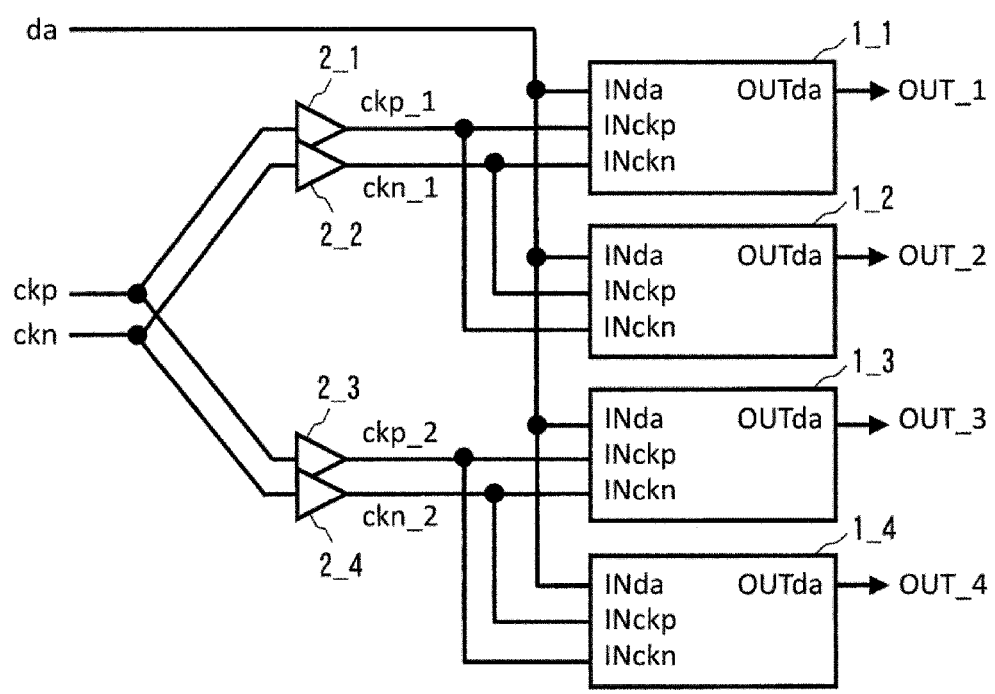
FIG. 2 is a block diagram illustrating a specific example of the track-and-hold circuit according to the first embodiment of the present invention.

A specific example will be described, to further facilitate understanding of the track-and-hold circuit according to the present embodiment. FIG. 2 illustrates a configuration of the track-and-hold circuit according to the present embodiment in a case in which N=2.

A first bias adjusting circuit 2_1 and a second bias adjusting circuit 2_2 raise or lower and output the DC bias voltage of at least one of input differential clock signals ckp and ckn so that the duty ratio, which is the ratio between a period in which the first positive-phase clock signal ckp_1 is High as to the first negative-phase clock signal ckn_1 and a period in which the first positive-phase clock signal ckp_1 is Low thereasto, becomes 3:1.

Figure 3:
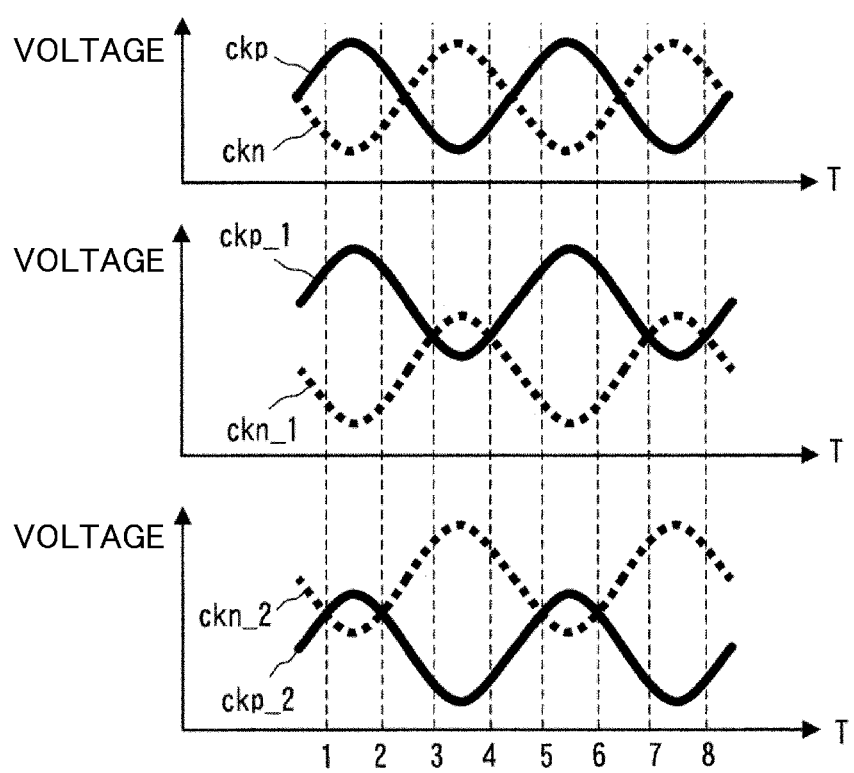
FIG. 3 is a timing chart of clock signals according to the first embodiment of the present invention.

A third bias adjusting circuit 2_3 and a fourth bias adjusting circuit 2_4 raise or lower and output the DC bias voltage of at least one of input differential clock signals ckp and ckn so that the duty ratio, which is the ratio between a period in which the second positive-phase clock signal ckp_2 is High as to the second negative-phase clock signal ckn_2 and a period in which the second positive-phase clock signal ckp_2 is Low thereasto, becomes 1:3. A timing chart of the clock signals ckp, ckn, ckp ckn ckp_2, and ckn_2, is shown in FIG. 3.

Next, the timings at which the sampling circuits to 1_4 in FIG. 2 sample the input signal da will be described.

The sampling circuit is a negative edge trigger type sampling circuit that takes the differential clock signals ckp_1 and ckn_1 as clock input. Accordingly, the sampling circuit 1_1 samples the input signal da at time T=3, and holds the sampled value to time T=4 (takes the voltage value of output signal OUT1 as the sampled value). From time T=4 to T=7 is track mode, with the output signal OUT1 tracking the input signal da. The sampling circuit then samples the input signal da at time T=7 again, and holds the sample value to time T=8.

The sampling circuit 1_2 is a positive edge trigger type sampling circuit that takes the differential clock signals ckp_1 and ckn_1 as clock input. The sampling circuit 1_2 samples the input signal da at time T=4, and holds the sampled value to time T=7 (takes the voltage value of output signal OUT2 as the sampled value). From time T=7 to T=8 is track mode, with the output signal OUT2 tracking the input signal da. The sampling circuit 1_2 then samples the input signal da at time T=8 again.

The sampling circuit 1_3 is a negative edge trigger type sampling circuit that takes the differential clock signals ckp_2 and ckn_2 as clock input. The sampling circuit 1_3 samples the input signal da at time T=2, and holds the sampled value to time T=5 (takes the voltage value of output signal OUT3 as the sampled value). From time T=5 to T=6 is track mode, with the output signal OUT3 tracking the input signal da. The sampling circuit 1_3 then samples the input signal da at time T=6 again.

The sampling circuit 1_4 is a positive edge trigger type sampling circuit that takes the differential clock signals ckp_2 and ckn_2 as clock input. The sampling circuit 1_4 samples the input signal da at time T=1, and holds the sampled value to time T=2 (takes the voltage value of output signal OUT4 as the sampled value). From time T=2 to T=5 is track mode, with the output signal OUT4 tracking the input signal da. The sampling circuit 1_4 then samples the input signal da at time T=5 again, and holds the sample value to time T=6.

According to the above, sampling is performed at time T=1, 2, ..., 8 by the sampling circuits 1_1 to 1_4 overall, and accordingly sampling frequency that is four times that of the clock frequency can be realized.

Figure 4:
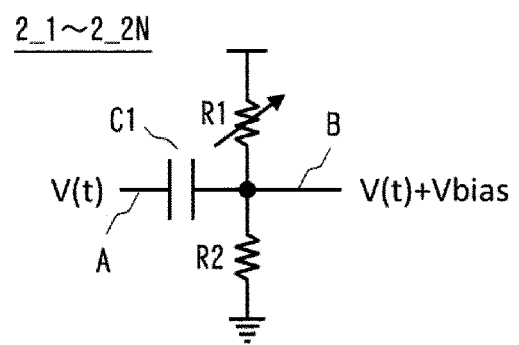
FIG. 4 is a circuit diagram illustrating a configuration example of a bias adjusting circuit according to the first embodiment of the present invention.

FIG. 4 is a circuit diagram illustrating a configuration example of the bias adjusting circuits 2_1 to 2_2N. The bias adjusting circuit illustrated in FIG. 4 is configured of a capacitor C1 of which one end is connected to an input terminal A of the bias adjusting circuit and the other end is connected to an output terminal B of the bias adjusting circuit, a variable resistor R1 of which one end is connected to power source voltage and the other end is connected to the output terminal B of the bias adjusting circuit, and a resistor R2 of which one end is connected to the output terminal B of the bias adjusting circuit and the other end is connected to a ground.

The bias adjusting circuit illustrated in FIG. 4 cuts the DC component of a clock signal V(t) at the capacitor C1, and thereafter superimposes DC voltage Vbias subjected to voltage division by the two resistors R1 and R2 on the clock signal V(t). Using a variable resistor for at least one of the resistors R1 and R2 enables the value of the DC voltage Vbias to be variable. R1 is a variable resistor in the example in FIG. 4.

Figure 5:
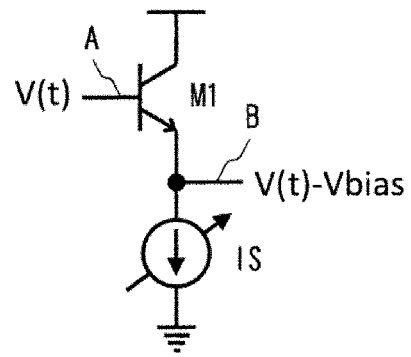
FIG. 5 is a circuit diagram illustrating a different configuration example of the bias adjusting circuit according to the first embodiment of the present invention.

FIG. 5 is a circuit diagram illustrating a different configuration example of the bias adjusting circuits 2_1 to 2_2N. The bias adjusting circuit illustrated in FIG. 5 is configured of a bipolar transistor M1 of which the base is connected to the input terminal A of the bias adjusting circuit, the collector is connected to the power source voltage, and the emitter is connected to the output terminal B of the bias adjusting circuit, and a variable current source IS of which one end is connected to the output terminal B of the bias adjusting circuit, and the other end is connected to the ground.

The bias adjusting circuit illustrated in FIG. 5 is an emitter follower circuit, and is capable of lowering the voltage of the clock signal V(t) by an amount equivalent to the voltage (DC voltage Vbias) across the base-emitter of the bipolar transistor M1 where the variable current source IS is a load. Changing the current value of the variable current source IS enables the value of the DC voltage Vbias to be variable.

The configuration of the bias adjusting circuits 2_1 to 2_2N is not limited to the configurations of FIG. 4 or FIG. 5. What is important in embodiments of the present invention is that the DC bias voltage of the clock signal is adjusted by some sort of means. Adjusting the DC bias voltage is widely performed in electronic circuits in general, and a wide variety of configurations are known as bias adjusting circuits.

Next, the configuration of the sampling circuits 1_1 to 1_2N will be described. An arrangement called a switch emitter following is well known as a circuit configuration for a sampling circuit (track-and-hold circuit).

Figure 6:
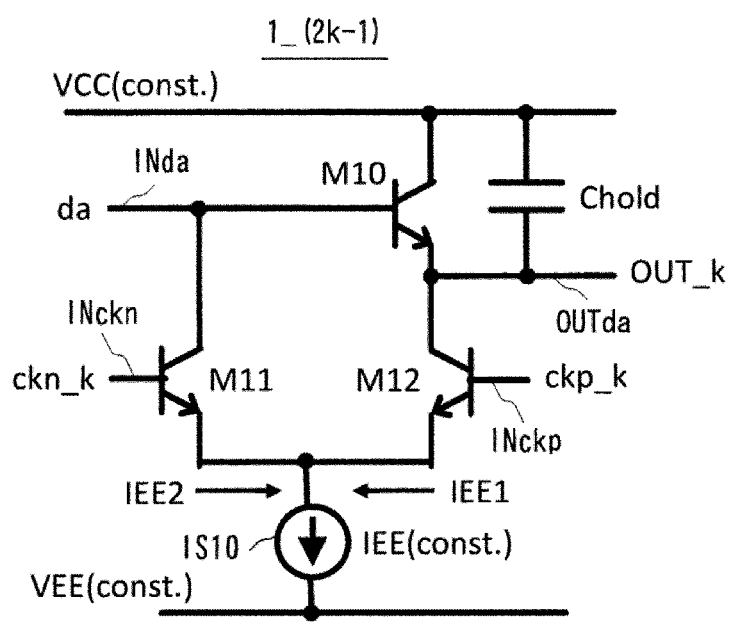
FIG. 6 is a circuit diagram illustrating a configuration example of a sampling circuit according to the first embodiment of the present invention.

FIG. 6 illustrates a typical configuration of a sampling circuit 1_(2k−1) using a bipolar transistor. VCC and VEE in FIG. 6 are power source voltages. Also, the (const.) in FIG. 6 indicates that the voltage or the current is constant regardless of time.

The sampling circuit 1_(2k−1) is configured of a bipolar transistor M10 of which the base is connected to a signal input terminal INda, the power source voltage VCC is applied to the collector, and the emitter is connected to a signal output terminal OUTda, a bipolar transistor M11 of which the base is connected to a negative-phase clock input terminal INckn and the collector is connected to the signal input terminal INda, a bipolar transistor M12 of which the base is connected to a positive-phase clock input terminal INckp and the collector is connected to the signal output terminal OUTda, a capacitor Chold to one end of which is applied the power source voltage VCC, and the other end is connected to the signal output terminal OUTda, and a constant current source IS10 of which one end is connected to the emitters of the bipolar transistors M11 and M12, and the other end is connected to the power source voltage VEE.

IEE1 and IEE2 are currents that flow from the emitters of the bipolar transistors M11 and M12 to the constant current source IS10. When assuming the current flowing at the constant current source IS10 to be IEE, IEE1+IEE2=IEE holds, due to Kirchhoff's current law.

Figure 7A:
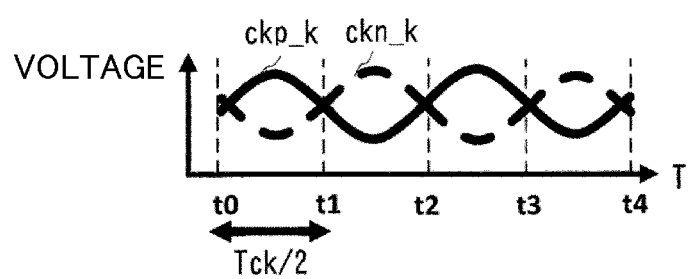
FIGS. 7A to 7E are diagrams showing signal waveforms at each portion of the sampling circuit according to the first embodiment of the present invention.
Figure 7B:
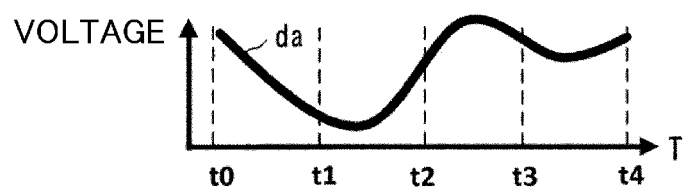
Figure 7C:
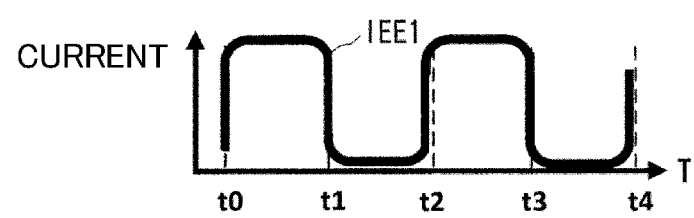
Figure 7D:
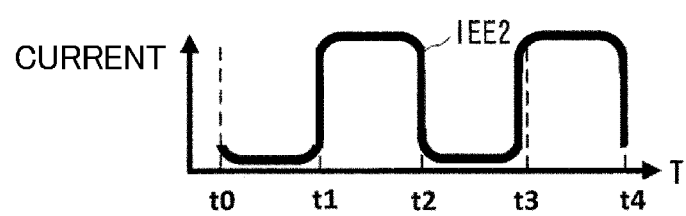
Figure 7E:
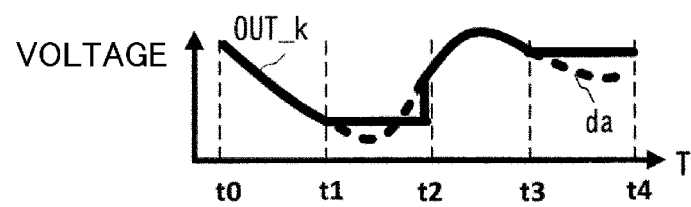

Basic operations of the sampling circuit 1_(2k−1) in FIG. 6 will be described with reference to FIGS. 7A to 7E. Here, the waveforms of the currents IEE1 and IEE2 when applying differential clock signals ckp_k and ckn_k of a cycle Tck shown in FIG. 7A and the input signal da shown in FIG. 7B to the sampling circuit 1_(2k−1) are shown in FIGS. 7C and 7D, and the waveform of an output signal OUT_k is shown in FIG. 7E. Times T=t0 to t4 are arrayed every constant interval Tck/2.

When the clock signal is High, i.e., when ckp_k>ckn_k (when time T satisfies to T≤t1 or t2≤T≤t3), the transistor M11 is OFF and the transistor M12 is ON, and accordingly IEE1=IEE and IEE2=0 hold. At this time, the PN junction of the base-emitter of the transistor M11 is in an ON state, and accordingly the emitter voltage of the transistor M11 (output signal OUT_k) tracks the input signal da. That is to say, when time T satisfies to T t1 or t2≤T≤t3, the sampling circuit 1_(2k−1) is in track mode.

Conversely, when the clock signal is Low, i.e., when ckp_k<ckn_k (when time T satisfies t1≤T≤t2 or t3=T≤t4), the transistor M11 is ON and the transistor M12 is OFF, and accordingly IEE1=0 and IEE2=IEE hold. Accordingly, no current flows to the transistor M11 and the PN junction of the base-emitter of the transistor M11 is in an OFF state, and thus the base and the emitter of the transistor M11 are electrically separated. At this time, the capacitor Chold holds the emitter voltage (output signals OUT_k) of the transistor M11 at the instant of the clock signal going from High to Low, and accordingly the output signal OUT_k is held at a constant value just while the clock signal is Low. That is to say, when time T satisfies t1≤T≤t2 or t3≤T≤t4, the sampling circuit 1_(2k−1) is in hold mode.

Thus, the operations of the sampling circuit 1_(2k−1) are to repeat alternating between the track mode and the hold mode, in accordance with High/Low of the clock signal.

The configuration of the sampling circuit 1_2k is the same to that of the sampling circuit 1_(2k-i). In the case of the sampling circuit 1_2k, the negative-phase clock signal ckn_k can be input to the positive-phase clock input terminal INckp, and the positive-phase clock signal ckp_k can be input to the negative-phase clock input terminal INckn.

As described above, according to the present embodiment, sampling can be performed at a high frequency, which is four times the clock frequency or more. Also, for a sampling frequency the same as with the conventional, using the present embodiment enables a slow clock signal of a frequency that is ¼ the sampling frequency or lower to be used, and the level demanded regarding the circuit design of the clock generating circuit, clock transmitting circuit, clock buffer, and track-and-hold circuit can be relaxed. Also, for a sampling frequency the same as with the conventional, electric power consumption can be reduced, and the timing margin can be increased.

There conventionally has been time interleaving as a method for realizing sampling frequency that is several times that of the clock frequency. The present embodiment has several advantages over time interleaving.

In time interleaving, a clock delay buffer that has a delay time corresponding to the clock frequency is used, and accordingly, basically only a clock frequency set in advance can be used. Although the delay time of the delay buffer can be varied somewhat in accordance with change in the clock frequency, enabling delay time to be variable severalfold is technologically difficult in analog circuits. Technology enabling delay time to be variable in analog circuits is normally used for fine timing adjustment.

Conversely, in the track-and-hold circuit according to the present embodiment, the circuit configuration is not dependent on the clock frequency in principle, and accordingly slow clock signals can be input when low speed is desired, fast clock signals can be input when high speed is desired, and the same circuit can be used with various frequencies depending on the usage.

Also, in the case of time interleaving, an inverter chain in which a plurality of inverters are connected, or the like, is used as the delay buffer. However, inverter chains include active devices such as transistors and so forth, and accordingly the circuit scale and the electric power consumption become great.

Conversely, in the track-and-hold circuit according to the present embodiment, a circuit called a bias adjusting circuit, which is normally smaller in scale than a delay buffer and that can be configured from passive devices alone in some cases, is used, and accordingly a small footprint and low electric power consumption can be realized.

Second Embodiment

Figure 8:
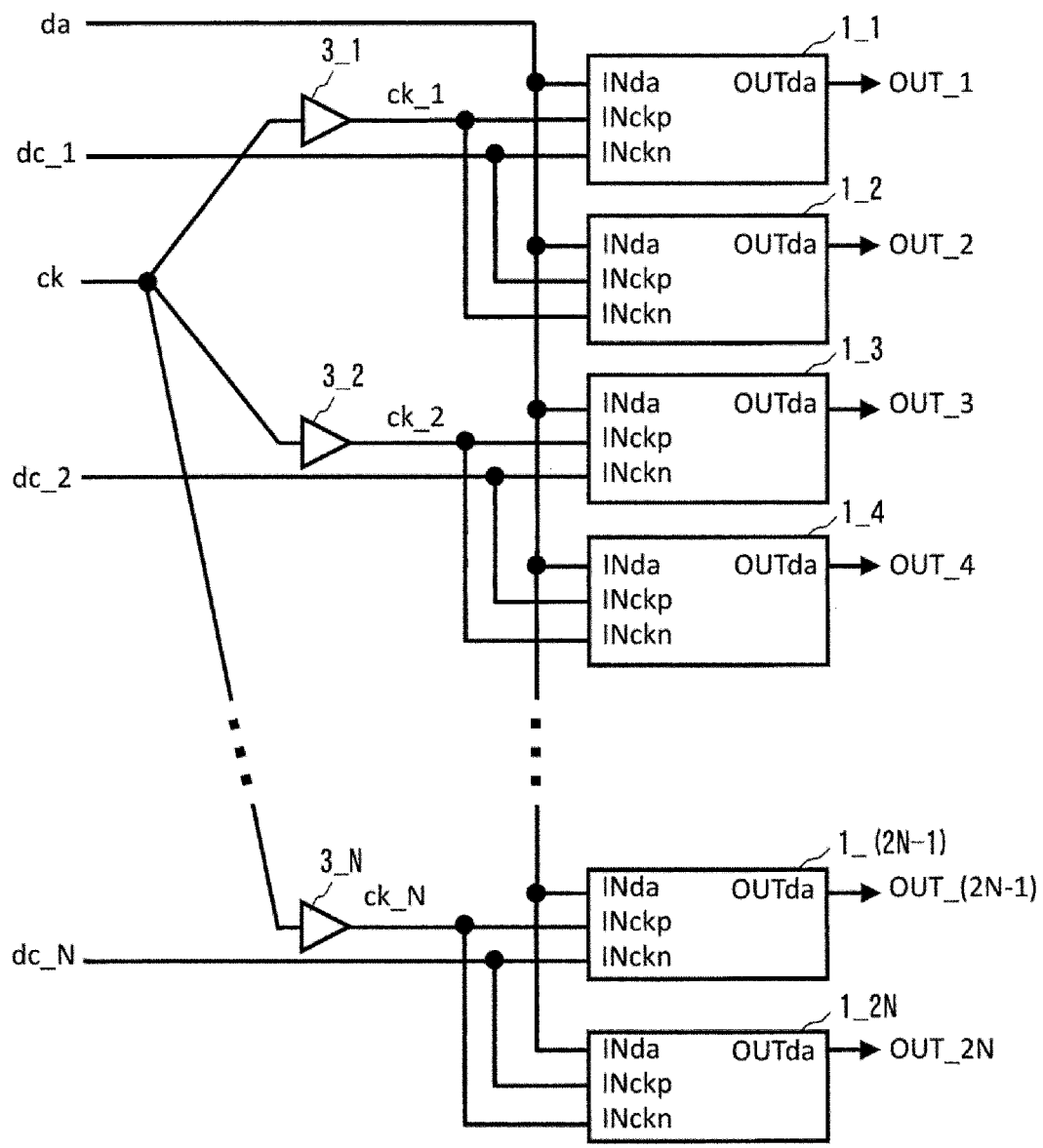
FIG. 8 is a block diagram illustrating a configuration of a track-and-hold circuit according to a second embodiment of the present invention.

Next, a second embodiment of the present invention will be described. FIG. 8 is a block diagram illustrating a configuration of a track-and-hold circuit according to the second embodiment of the present invention. The track-and-hold circuit according to the present embodiment is provided with 2N sampling circuits 1_1 to 1_2N, and N bias adjusting circuits 3_1 to 3_N that adjust the DC bias voltage of the clock signals input to the sampling circuits 1_1 to 1_2N.

The essence of the present embodiment is that even when the negative-phase clock signal ckn in the first embodiment is replaced with DC voltage, the same advantages as the duty ratio of the differential clock signals ckp and ckn described in the first embodiment can be realized.

A single-phase clock signal ck and N DC voltages dc_1 to dc_N are used in the present embodiment. A kth (where k is an integer equal to or greater than 1 and equal to or less than N) bias adjusting circuit 3_k raises or lowers and outputs the DC bias voltage of the input clock signal ck so that the duty ratio, which is the ratio between a period in which a kth clock signal ck_k is High as to a kth DC voltage dc_k and a period in which the kth clock signal ck_k is Low thereasto, becomes $(2N-2k+1):(2k-1)$.

Figure 9:
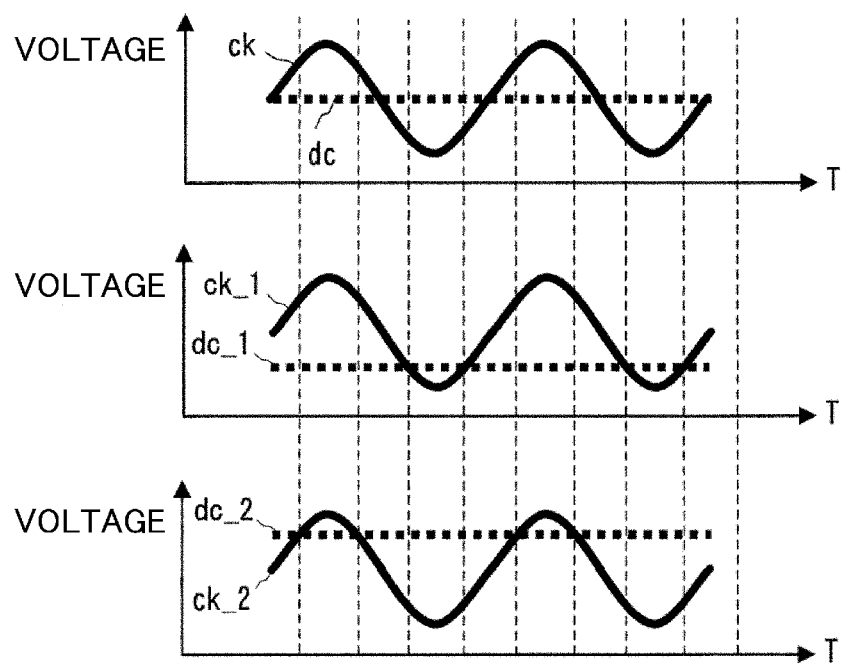
FIG. 9 is a timing chart of clock signals according to the second embodiment of the present invention.

The clock signal ck_k is input to the positive-phase clock input terminal INckp of the $(2k-1)$th sampling circuit 1_$(2k-1)$, and the DC voltage dc_k is input to the negative-phase clock input terminal INckn of the sampling circuit 1_$(2k-1)$. Simultaneously with this, the clock signal ck_k is input to the negative-phase clock input terminal INckn of the 2kth sampling circuit 1_2k, and the DC voltage dc_k is input to the positive-phase clock input terminal INckp of the sampling circuit 1_2k. FIG. 9 shows a timing chart of the clock signals ck, ck_1, and ck_2. In FIG. 9, dc represents the DC voltage of the clock signal ck.

The configuration and operations of the sampling circuits 1_1 to 1_2N are as described in the first embodiment.

Generally, clock signals are generated with a single phase to begin with, and when there is a need to use differential clock signals, there is a need to perform single-phase/differential conversion using a circuit called a balun. In the present embodiment, a single-phase clock signal alone is sufficient, and accordingly there is no need to perform single-phase/differential conversion. Also, the DC voltages dc_1 to dc_N are easy to create and easy to handle. Note that the DC voltages dc_1 to dc_N may be of the same value, or may be different values.

Third Embodiment

Figure 10:
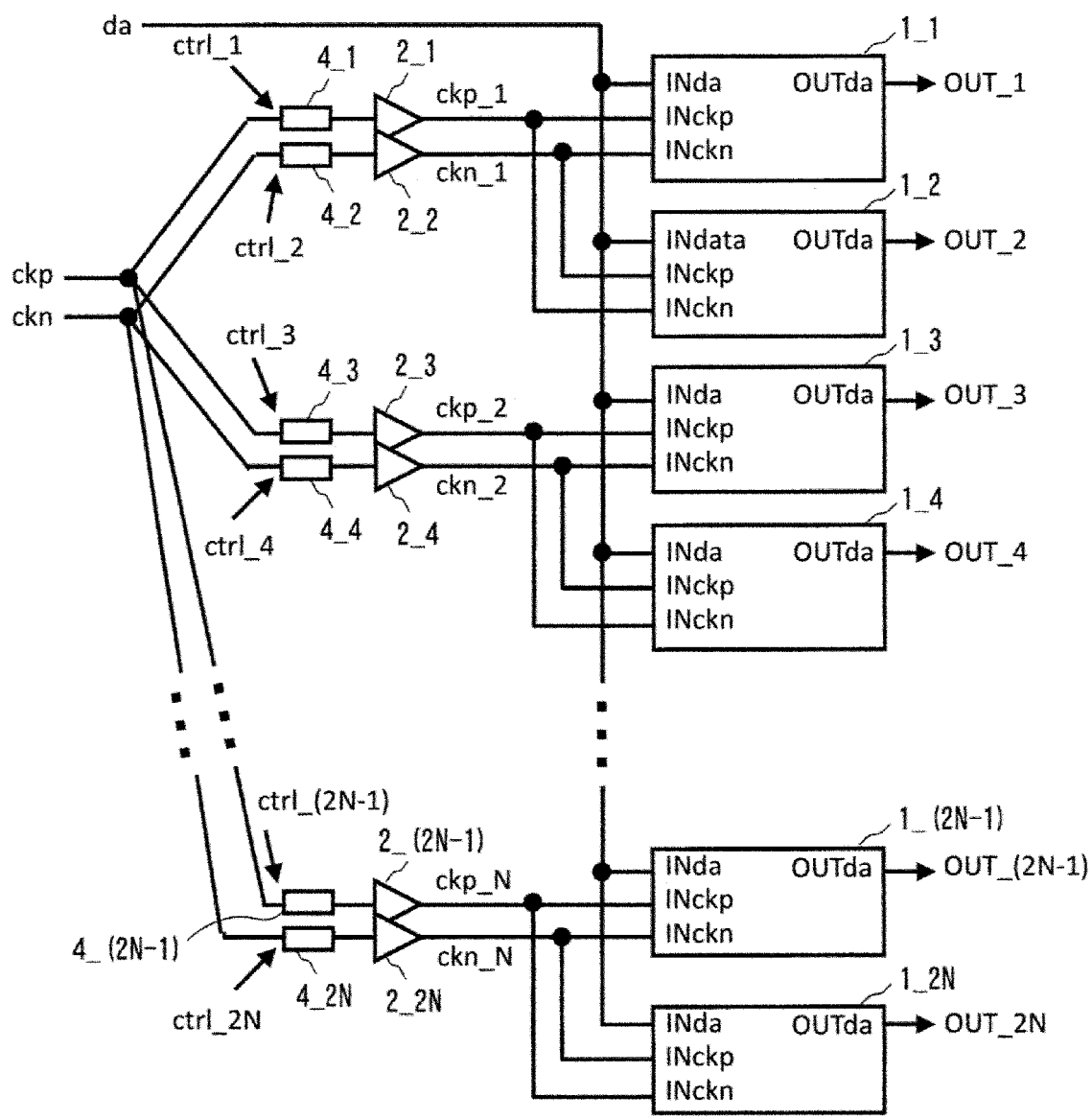
FIG. 10 is a block diagram illustrating a configuration of a track-and-hold circuit according to a third embodiment of the present invention.

Next, a third embodiment of the present invention will be described. FIG. 10 is a block diagram illustrating a configuration of a track-and-hold circuit according to the third embodiment of the present invention. The track-and-hold circuit according to the present embodiment is an arrangement in which switches 4_1 to 4_2N have been respectively added upstream of the 2N bias adjusting circuits 2_1 to 2_2N in the configuration of the first embodiment.

There is little difference in the basic circuit configuration in the first and second embodiments. Adding the switches 4_1 to 4_2N that turn input of clock signals to the bias adjusting circuits 2_1 to 2_2N on/off in accordance with control signals ctrl_1 to ctrl_2N in the circuit according to the first embodiment enables the same circuit to be used as the configuration of the first embodiment, or to be used as the configuration of the second embodiment.

Specifically, the circuit in FIG. 10 can be used as the configuration of the first embodiment by turning all of the switches 4_1 to 4_2N on.

Also, the circuit in FIG. 10 can be used as the configuration of the second embodiment by turning the $(2k-1)$th switch 4_$(2k-1)$ on by the $(2k-1)$th (where k is an integer equal to or greater than 1 and equal to or less than N) control signal ctrl_$(2k-1)$ and turning the 2kth switch 4_2k off by the 2kth control signal ctrl_2k. In a case in which the switch 4_2k turns off, the 2kth bias adjusting circuit 2_2k outputs DC voltage set in advance.

Fourth Embodiment

Next, a fourth embodiment of the present invention will be described. In the first to third embodiments, the DC bias values of the bias adjusting circuits have been described as being fixed. That is to say, the value of the DC bias voltage is decided by values of resistance and so forth decided at the time of circuit design, and the user cannot change the DC bias voltage of the track-and-hold circuit at a later time.

However, generally, error between design and actual circuit characteristics, such as variance in semiconductor process and so forth, is commonplace. In a case in which the duty ratio, which is the ratio between a period in which the positive-phase clock signal ckp_k (where k is an integer equal to or greater than 1 and equal to or less than N) is High as to the negative-phase clock signal ckn_k and a period in which the positive-phase clock signal ckp_k is Low thereasto, does not accurately become $(2N-2k+1):(2k-1)$, timing error occurs in sampling of the input signal da, and the sampled value contains error as a result. Accordingly, being provided with a function by which the DC bias voltage of the bias adjusting circuit can be adjusted and controlled, so that the user can accurately set the duty ratio of the clock signals to $(2N-2k+1):(2k-1)$, is preferable.

Figure 11:
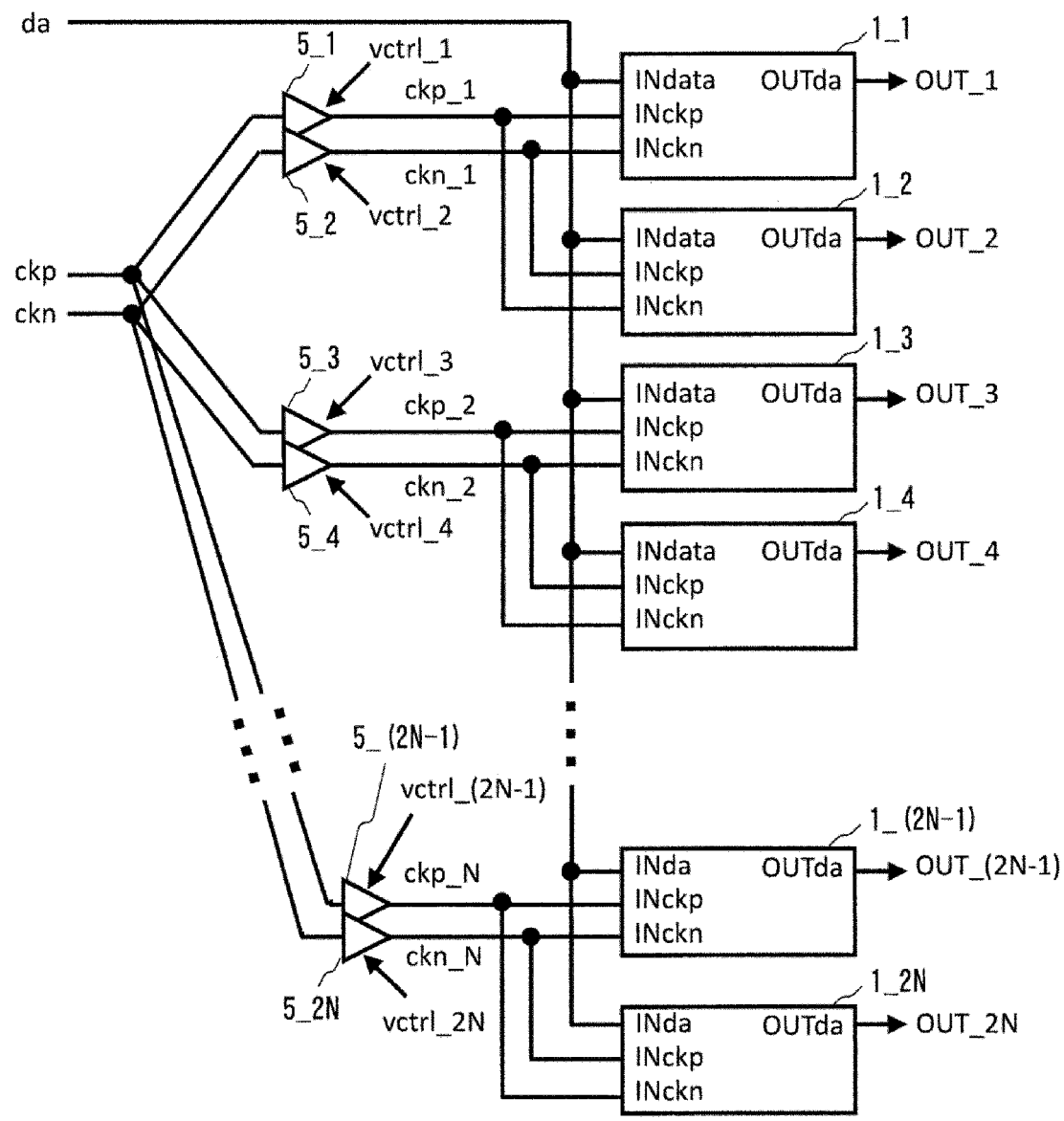
FIG. 11 is a block diagram illustrating a configuration of a track-and-hold circuit according to a fourth embodiment of the present invention.

FIG. 11 is a block diagram illustrating a configuration of a track-and-hold circuit according to the fourth embodiment of the present invention. The track-and-hold circuit according to the present embodiment is provided with 2N sampling circuits 1_1 to 1_2N, and 2N bias adjusting circuits 5_1 to 5_2N that are capable of adjusting the DC bias voltage of the differential clock signals input to the sampling circuits 1_1 to 1_2N in accordance with externally input control signals vctrl_1 to vctrl_2N.

As described above, it is sufficient for the user to provide the bias adjusting circuits 2_(2k-1) and 2_2k with control signals vctrl_(2k-i) and vctrl_2k, so that the duty ratio, which is the ratio between a period in which a positive-phase clock signal ckp_k is High as to the negative-phase clock signal ckn_k and a period in which the positive-phase clock signal ckp_k is Low thereasto, becomes $(2N-2k+1):(2k-1)$.

Note that N bias adjusting circuits 5_1 to 5_N may be provided instead of the bias adjusting circuits 3_1 to 3_N according to the second embodiment.

Also, bias adjusting circuits 5_1 to 5_2N may be provided instead of the bias adjusting circuits 2_1 to 2_2N according to the third embodiment.

Fifth Embodiment

Next, a fifth embodiment of the present invention will be described. In the first to fourth embodiments, output signals OUT_1 to OUT_2N as to the same input signal da are output from separate terminals. With regard to the first to fourth embodiments, an A/D converter can be realized by providing 2N quantizers that take each of the output signals OUT_1 to OUT_2N as input of the track-and-hold circuit, integrate the digital signals output from the quantizers by signal processing, and extract as a single output signal.

Conversely, in a case of using only one quantizer, this can be performed by providing a multiplexer downstream of the track-and-hold circuit, and switch the multiplexer to constantly select, from the output signals OUT_1 to OUT_2N, the output signal of the sampling circuit that was most recently in hold mode, and output to the quantizer.

Figure 12:
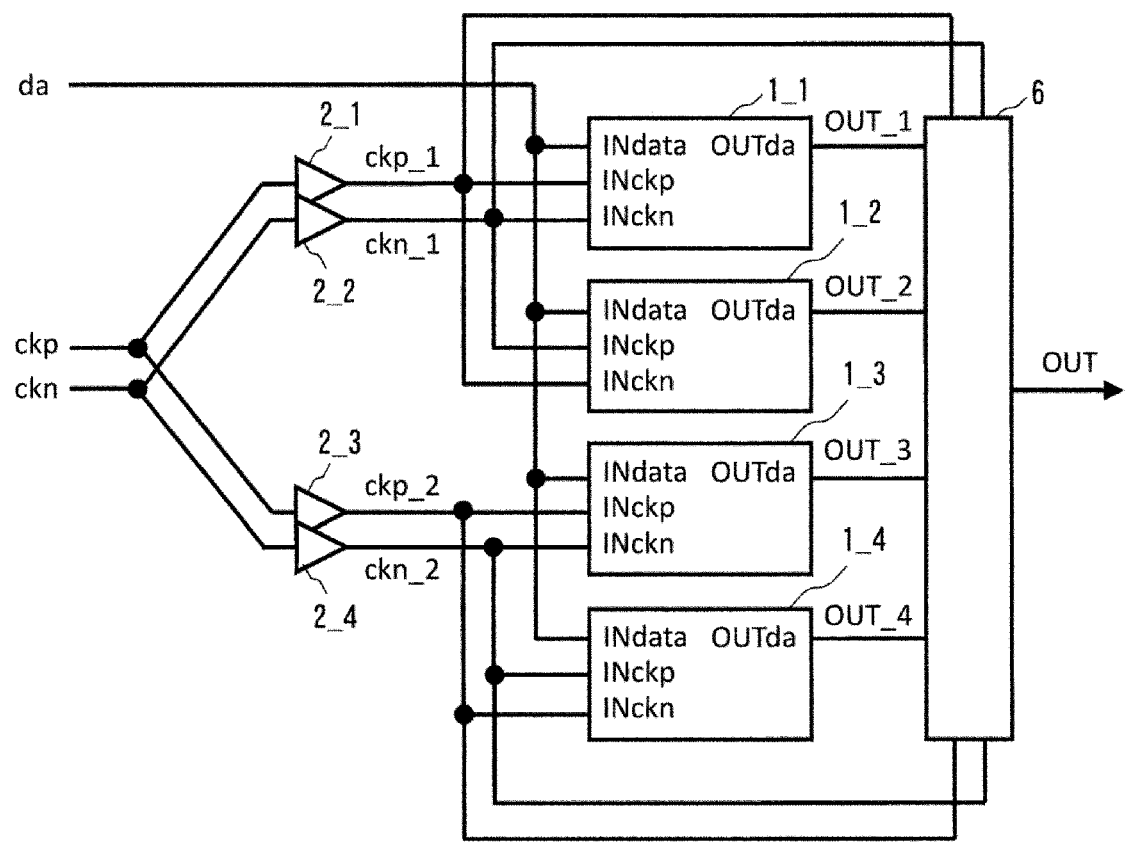
FIG. 12 is a block diagram illustrating a configuration of a track-and-hold circuit according to a fifth embodiment of the present invention.

FIG. 12 is a block diagram illustrating a configuration of a track-and-hold circuit according to the fifth embodiment of the present invention. The track-and-hold circuit according to the present embodiment is provided with 2N (N=2 in the present embodiment) sampling circuits 1_1 to 1_4, 2N bias adjusting circuits 2_1 to 2_4, and an analog multiplexer 6 that is provided downstream of the sampling circuits 1_1 to 1_4, and that references the clock signals output from the bias adjusting circuits 2_1 to 2_4, and selects and outputs, from the output signals OUT_1 to OUT_4 of the sampling circuits 1_1 to 1_4, the output signal of the sampling circuit that was most recently in hold mode.

The analog multiplexer 6 references the ckp_1, ckn_1, ckp_2, and ckn_2, which are output from the bias adjusting circuits 2_1 to 2_4, and selects and outputs the output signal of one sampling circuit out of the sampling circuits 1_1 to 1_4. For example, describing operations in a case of N=2 by way of FIG. 3, the sampling circuit 1_4 goes to hold mode at time T=1, and accordingly the analog multiplexer 6 selects the output signal OUT_4, and the sampling circuit 1_3 goes to hold mode at time T=2, and accordingly the analog multiplexer 6 selects and outputs the output signal OUT_3.

Also, the sampling circuit 1_1 goes to hold mode at time T=3, and accordingly the analog multiplexer 6 selects and outputs the output signal OUT_1, and the sampling circuit 1_2 goes to hold mode at time T=4, and accordingly the analog multiplexer 6 selects and outputs the output signal OUT_2.

Thus, the output of the sampling circuit that was most recently in hold mode can constantly be selected.

In the present embodiment, a series of data is singularly output, as compared to the form in which output signals OUT_1 to OUT_2N are output from separate terminals as in the first to fourth embodiments, and accordingly downstream signal processing is simple.

Although an example of applying the analog multiplexer 6 to the first embodiment is illustrated in the present embodiment, application may be made to the second to fourth embodiments.

In a case of applying to the second embodiment, the analog multiplexer 6 can reference the clock signals ck_1 to ck_N and the DC voltages dc_1 to dc_N that are output from the bias adjusting circuits 3_1 to 3_N, and constantly select and output the output signal of the sampling circuit out of the sampling circuits 1_1 to 1_2N that was most recently in hold mode.

Sixth Embodiment

Next, a sixth embodiment of the present invention will be described. Although the first and third to fifth embodiments assume input of differential clock signals, generating differential clock signals is normally performed by generating a single-phase clock signal having a desired frequency, and thereafter performing single-phase/differential conversion using a circuit called a balun. On-chip mounting of the balun as part of the track-and-hold circuit is also conceivable, from the perspective of ease of handling the track-and-hold circuit. On-chip mounting of the balun does away with the need to input differential clock signals to the track-and-hold circuit, and single-phase/differential conversion is no longer necessary.

Figure 13:
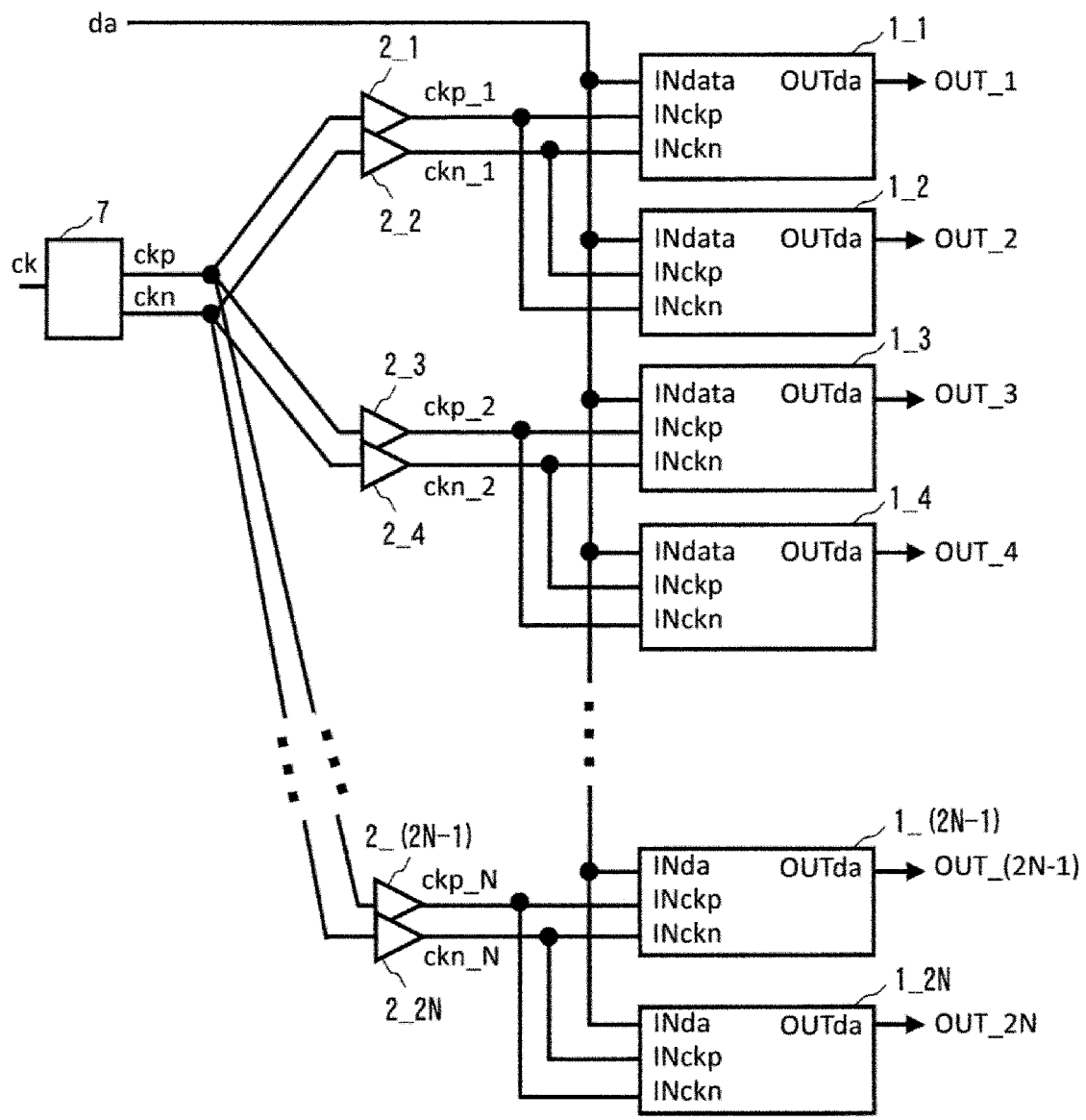
FIG. 13 is a block diagram illustrating a configuration of a track-and-hold circuit according to a sixth embodiment of the present invention.

FIG. 13 is a block diagram illustrating a configuration of a track-and-hold circuit according to the sixth embodiment of the present invention. The track-and-hold circuit according to the present embodiment is provided with 2N sampling circuits 1_1 to 1_2N, 2N bias adjusting circuits 2_1 to 2_2N, and a balun 7 that is provided upstream of the bias adjusting circuits 2_1 to 2_2N and that converts the single-phase clock signal ck into differential clock signals ckp and ckn for the sampling circuits 1_1 to 1_2N.

Although an example of applying the balun 7 to the first embodiment is illustrated in the present embodiment, application may be made to the third to fifth embodiments.

In a case of applying to the third embodiment, the balun 7 can be provided upstream of the switches 4_1 to 4_2N.

Seventh Embodiment

Next, a seventh embodiment of the present invention will be described. In the first to sixth embodiments, the amplitudes of the clock signals differ between High and Low, as can be seen from the timing charts in FIGS. 3 and 9, for example, due to adjusting the duty ratio by adjusting the DC bias voltage of differential clock signals or single-phase clock signals. In the first embodiment in particular, the greater the numerical value of N is, the greater the difference in amplitude of clock signals between High and Low is, and there is a possibility that a problem such as described below will occur.

With the differential clock signals ckp_1 and ckn_1 in FIG. 3 as an example, the ratio between the amplitude in the period in which the positive-phase clock signal ckp_1 is High as to the negative-phase clock signal ckn_1 and the amplitude in the period in which this is Low is 3:1, and the amplitude when Low is small. Accordingly, there is concern that the sampling circuit 1_1 may not recognize that the clock signal ckp_1 is Low, and not go to a complete hold mode. In the same way, there is concern that the sampling circuit 1_2 may not recognize that the clock signal ckp_1 is Low, and not go to a complete track mode.

In order to prevent such problems from occurring, the amplitude of the differential clock signals ckp and ckn can be made to be sufficiently great. However, making the amplitude of the differential clock signals ckp and ckn great causes the amplitude of the clock signal ckp_k or the clock signal ckn_k to be drastically great when at High, and there is concern that the voltage withstanding limit of the transistors of the sampling circuits 1_(2k−1) and 1-2k will be exceeded, which might obstruct normal operations or cause failure of the circuits. Accordingly, in the present embodiment, comparators are provided between the bias adjusting circuits and the sampling circuits.

Figure 14:
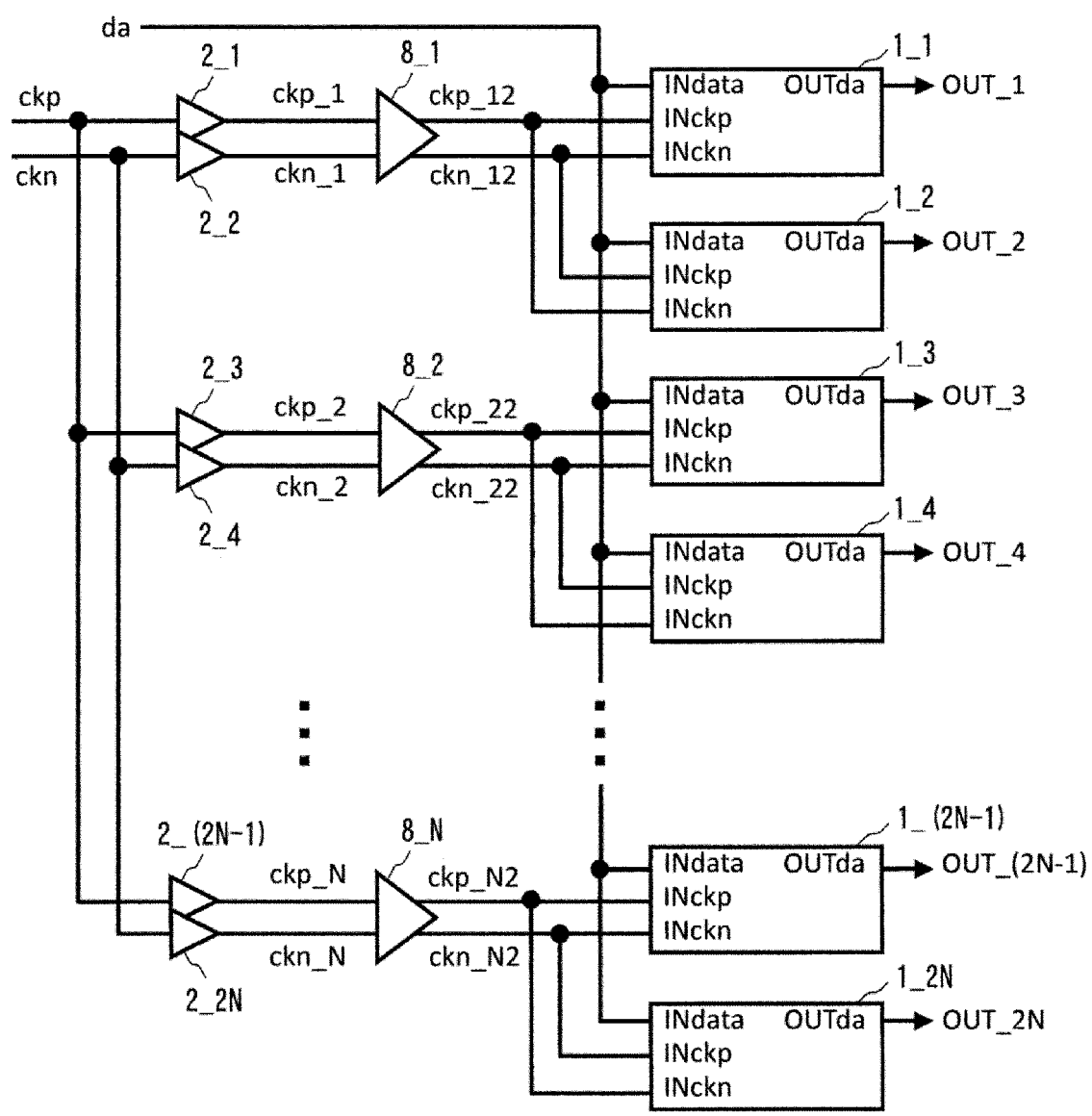
FIG. 14 is a block diagram illustrating a configuration of a track-and-hold circuit according to a seventh embodiment of the present invention.

FIG. 14 is a block diagram illustrating a configuration of a track-and-hold circuit according to the seventh embodiment of the present invention. The track-and-hold circuit according to the present embodiment is provided with 2N sampling circuits 1_1 to 1_2N, 2N bias adjusting circuits 2_1 to 2_2N, and N differential-input differential-output type comparators 8_1 to 8_N, one each thereof interposed between the bias adjusting circuits 2_(2k−1) and 2_2k (where k is an integer equal to or greater than 1 and equal to or less than N) and the sampling circuits 1_(2k−1) and 1_2k.

The clock signal ckp_k output from the bias adjusting circuit 2_(2k-1) is input to the positive-phase input terminal of the comparator 8_k. The clock signal ckn_k output from the bias adjusting circuit 2_2k is input to the negative-phase input terminal of the comparator 8_k.

The comparator 8_k outputs differential clock signals ckp_k2 and ckn_k2 that are fixed to High or Low, on the basis of the magnitude relation between the clock signals ckp_k and ckn_k. The clock signal ckp_k2 is input to the positive-phase clock input terminal INckp of the sampling circuit 1_(2k−1) and the negative-phase clock input terminal INckn of the sampling circuit 1_2k. The clock signal ckn_k2 is input to the negative-phase clock input terminal INckn of the sampling circuit 1_(2k−1) and the positive-phase clock input terminal INckp of the sampling circuit 1_2k.

Figure 15:
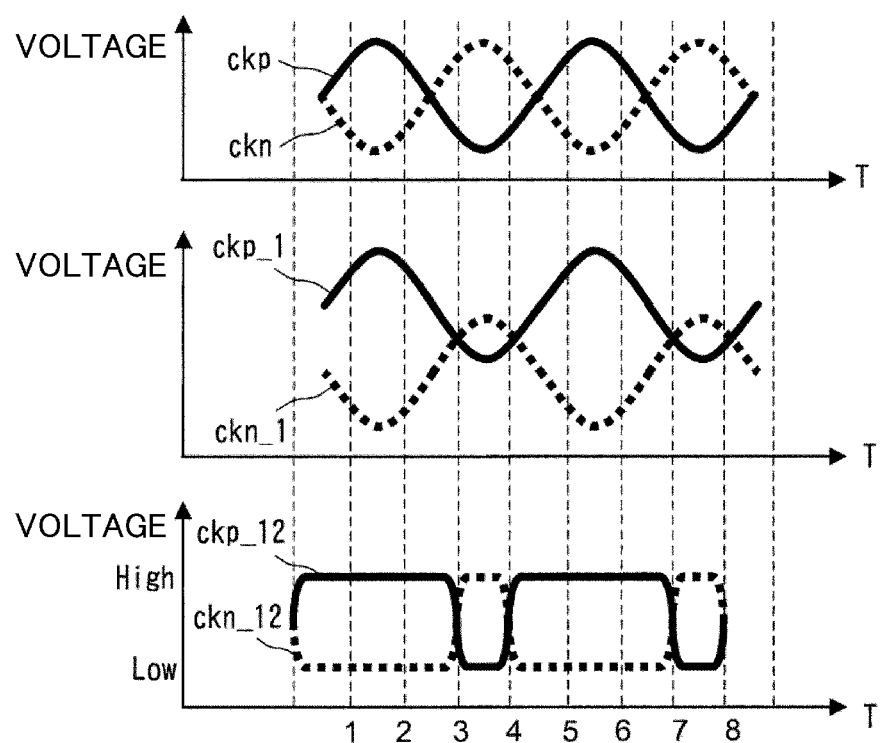
FIG. 15 is a timing chart of clock signals according to the seventh embodiment of the present invention.
Figure 16:
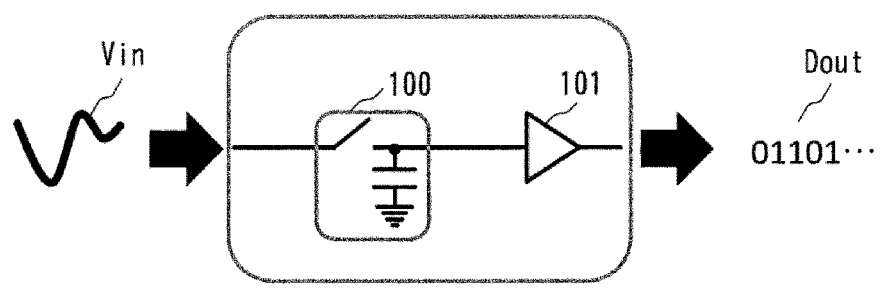
FIG. 16 is a block diagram illustrating a configuration of a conventional A/D converter.
Figure 17A:
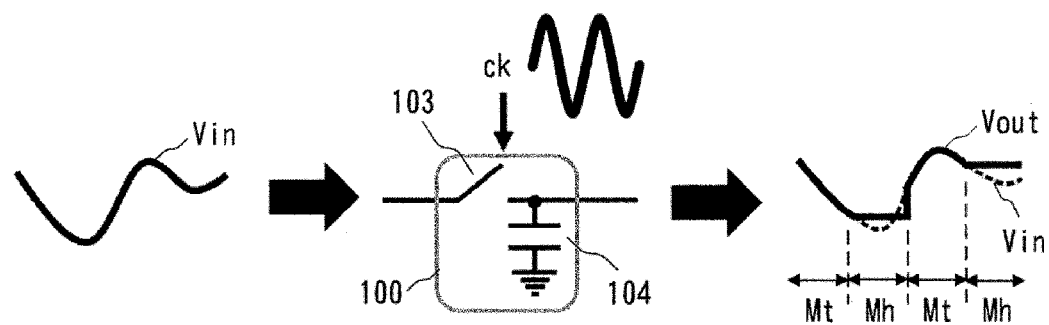
FIGS. 17A to 17C are diagrams for describing operations of a track-and-hold circuit.
Figure 17B:
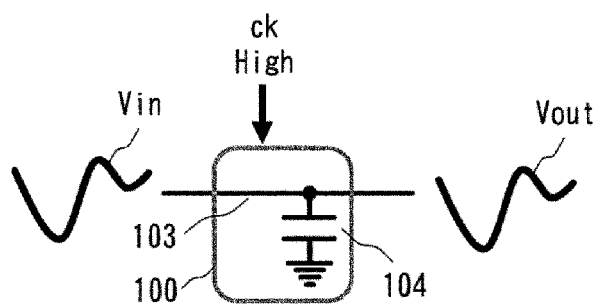
Figure 17C:
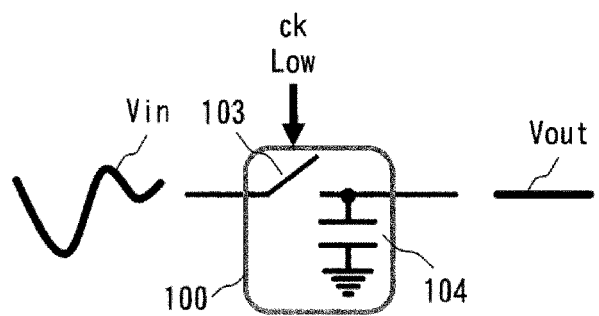
Figure 18:
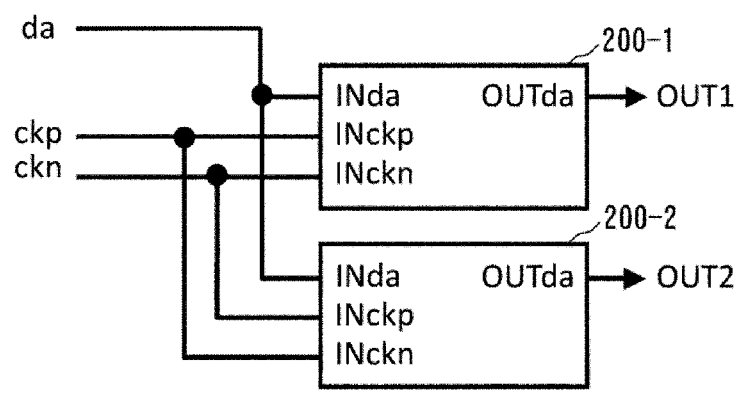
FIG. 18 is a block diagram illustrating a configuration of a different conventional track-and-hold circuit.

A timing chart of clock signals ckp, ckn, ckp_1, ckn_1, ckp_12, and ckn_12 is shown in FIG. 15. The ratio between the amplitude in the period in which the positive-phase clock signal ckp_1 is High as to the negative-phase clock signal ckn_1 and the amplitude in the period in which this is Low is 3:1, and the amplitude in the period when High is great and the amplitude in the period when Low is small.

Conversely, the comparator 8_k sets the clock signal ckp_k2 to High and ckn_k2 to Low when the clock signal ckp_k is greater than the clock signal ckn_k, and sets the clock signal ckp_k2 to Low and ckn_k2 to High when the clock signal ckp_k is not greater than the clock signal ckn_k. Thus, the comparator 8_k outputs clock signals ckp_k2 and ckn_k2 with the voltage level fixed to High or Low, with the duty ratio of the input clock signals ckp_k and ckn_k unchanged.

Thus, in the present embodiment, sure switching of the track mode and the hold mode of the sampling circuits 1_1 to 1_2N can be guaranteed, and clock signals of an excessively great amplitude can also be kept from being input to the sampling circuits 1_1 to 1_2N.

Although an example of applying the comparators 8_1 to 8_N to the first embodiment is illustrated in the present embodiment, application may be made to the second to sixth embodiments.

In a case of applying to the second embodiment, the clock signal ck_k can be input to the positive-phase input terminal of the comparator 8_k, and the DC voltage dc_k can be input to the negative-phase input terminal. Also, instead of inputting the clock signal ck_k and the DC voltage dc_k to the sampling circuits 1_(2k−1) and 1_2k, the positive-phase clock signal ckp_k2 output from the comparator 8_k can be input to the positive-phase clock input terminal INckp of the sampling circuit 1_(2k−1) and the negative-phase clock input terminal INckn of the sampling circuit 1_2k, and the negative-phase clock signal ckn_k2 output from the comparator 8_k can be input to the negative-phase clock input terminal INckn of the sampling circuit 1_(2k−1) and the positive-phase clock input terminal INckp of the sampling circuit 1_2k.

Although a case in which the clock signals ck, ckp, and ckn are sine waves is described in the first to seventh embodiments, the clock signals ck, ckp, and ckn may be waveforms other than square waves, such as triangle waves or sawtooth waves, for example.

The embodiments shown above only show examples of application to assist in understanding of the principle of the present invention, and embodiments in actual practice encompass a great number of modifications made without departing from the spirit of the present invention.

INDUSTRIAL APPLICABILITY

Embodiments of the present invention can be applied to a track-and-hold circuit.

REFERENCE SIGNS LIST

1_1 to 1_2N Sampling circuit
2_1 to 2_2N, 3_1 to 3_N, 5_1 to 5_N Bias adjusting circuit
4_1 to 4_2N Switch
6 Analog multiplexer
7 Balun
8_1 to 8_N Comparator
M1, M10 to M12 Bipolar transistor
IS Variable current source
IS10 Constant current source
C1, Chold Capacitor
R1 Variable resistor
R2 Resistor.

The invention claimed is:
1. A track-and-hold circuit, comprising:
2N bias adjusting circuits configured to adjust a DC bias voltage of input differential clock signals including a positive-phase clock signal and a negative-phase clock signal, wherein N is an integer equal to or more than 2; and
2N sampling circuits each including a signal input terminal, a signal output terminal, a positive-phase clock input terminal, and a negative-phase clock input terminal second clock input terminal, the 2N sampling circuits each being configured to switch between:
  a track mode in which an output signal output from the signal output terminal tracks an input signal input to the signal input terminal; and
  a hold mode in which a value of the input signal at a timing of switching from the track mode to the hold mode is held and output, in accordance with the positive-phase clock signal and a negative-phase clock signal of the differential clock signals output from the bias adjusting circuits,
wherein the (2k−1)th bias adjusting circuit or the 2kth bias adjusting circuit adjust the DC bias voltage of a positive-phase clock signal or a negative-phase clock signal of the input differential clock signals and output the positive-phase clock signal and the negative-phase clock signal with an adjusted DC bias voltage such that a duty ratio becomes (2N-2k+1):(2k−1),
wherein where k is an integer equal to or greater than 1 and equal to or less than N,
wherein the duty ratio is a ratio between a period in which the positive-phase clock signal is High as to the negative-phase clock signal and a period in which the positive-phase clock signal is Low as to the negative-phase clock signal, and
wherein the positive-phase clock signal output from the (2k−1)th bias adjusting circuit is input to the positive-phase clock input terminal of the (2k−1)th sampling circuit and the negative-phase clock input terminal of the 2kth sampling circuit, and the negative-phase clock signal output from the 2kth bias adjusting circuit is input to the negative-phase clock input terminal of the (2k−1)th sampling circuit and the positive-phase clock input terminal of the 2kth sampling circuit.

2. The track-and-hold circuit according to claim 1, further comprising:
  2N switches that are each provided upstream of the 2N bias adjusting circuits, wherein each of the 2N switches is configured to perform on/off of input of clock signals to the 2N bias adjusting circuits in accordance with externally input control signals.

3. The track-and-hold circuit according to claim 1, further comprising:
  a multiplexer that is provided downstream of the 2N sampling circuits, and that is configured to:
    reference clock signals output from the 2N bias adjusting circuits; and
    select and output, from output signals of the 2N sampling circuits, an output signal of a sampling circuit that was most recently in the hold mode.

4. The track-and-hold circuit according to claim 1, further comprising:
  a balun configured to convert a single-phase clock signal into differential clock signals to the 2N bias adjusting circuits.

5. The track-and-hold circuit according to claim 1, further comprising:
  N comparators of which one each is interposed between the (2k−1)th and 2kth bias adjusting circuits and the (2k−1)th and 2kth sampling circuits, and the N comparators are differential-input differential-output type comparators.

6. The track-and-hold circuit according to claim 1, wherein the bias adjusting circuits are configured to adjust the DC bias voltage applied to the input differential clock signals in accordance with an externally input control signal.

7. The track-and-hold circuit according to claim 6, wherein the bias adjusting circuits are configured to adjust the DC bias voltage applied to the input clock signals in accordance with an externally input control signal.

8. The track-and-hold circuit according to claim 6, further comprising:
  a multiplexer that is provided downstream of the 2N sampling circuits, and that is configured to:
    reference clock signals output from the N bias adjusting circuits and the N DC voltages; and
    select and output, from output signals of the 2N sampling circuits, an output signal of a sampling circuit that was most recently in hold mode.

9. The track-and-hold circuit according to claim 8, wherein the bias adjusting circuits are configured to adjust the DC bias voltage applied to the input clock signals in accordance with an externally input control signal.

10. A track-and-hold circuit, comprising:
  N bias adjusting circuits each configured to adjust a DC bias voltage of an input clock signal, wherein N is an integer equal to or more than 2; and
  2N sampling circuits each including a signal input terminal, a signal output terminal, a positive-phase clock input terminal, and a negative-phase clock input terminal second clock input terminal, each of the 2N sampling circuits being configured to switch between:
    a track mode in which an output signal output from the signal output terminal tracks an input signal input to the signal input terminal; and
    a hold mode in which a value of the input signal at a timing of switching from the track mode to the hold mode is held and output, in accordance with the clock signal output from a respective one of the bias adjusting circuits and an externally input DC voltage;
  wherein a kth bias adjusting circuit adjusts the DC bias voltage of the input clock signal and outputs a kth clock signal with an adjusted DC bias voltage such that a duty ratio becomes (2N-2k+1): (2k−1);
  wherein the duty ratio is a ratio between a period in which the kth clock signal is High as to a kth externally input DC voltage and a period in which the kth clock signal is Low as to the kth externally input DC voltage; and
  wherein the kth clock signal output from the kth bias adjusting circuit is input to the positive-phase clock input terminal of the (2k−1)th sampling circuit and the negative-phase clock input terminal of the 2kth sampling circuit, and the kth externally input DC voltage is input to the negative-phase clock input terminal of the (2k−1)th sampling circuit and the positive-phase clock input terminal of the 2kth sampling circuit.

11. A track-and-hold circuit, comprising:
  N bias adjusting circuits each configured to adjust a DC bias voltage of an input clock signal, wherein N is an integer equal to or more than 2;
  2N sampling circuits each including a signal input terminal, a signal output terminal, a positive-phase clock input terminal and a negative-phase clock input terminal second clock input terminal, each of the 2N sampling circuits being configured to switch between:
    a track mode in which an output signal output from the signal output terminal tracks an input signal input to the signal input terminal; and a hold mode in which a value of the input signal at a timing of switching from the track mode to the hold mode is held and output, in accordance with the clock signal output from respective one of the bias adjusting circuits and an externally input DC voltage, and N comparators of which one each is interposed between the kth bias adjusting circuit and the ($2k-1$)th and $2k$th sampling circuits, and that are differential-input differential-output type comparators that take as input the kth clock signal output from the kth bias adjusting circuit and the kth DC voltage that is externally input, wherein a kth bias adjusting circuit adjusts the DC bias voltage of the input clock signal and outputs a kth clock signal with an adjusted DC bias voltage such that a duty ratio becomes ($2N-2k+1$): ($2k-1$);

wherein k is an integer equal to or greater than 1 and equal to or less than N;

wherein the duty ratio is a ratio between a period in which the kth clock signal is High as to a kth externally input DC voltage and a period in which the kth clock signal is Low as to the kth externally input DC voltage; and wherein a kth positive-phase clock signal output from the kth comparator is input to a positive-phase clock input terminal of the ($2k-1$)th sampling circuit and a negative-phase clock input terminal of the $2k$th sampling circuit, and a kth negative-phase clock signal output from the kth comparator is input to a negative-phase clock input terminal of the ($2k-1$)th sampling circuit and a positive-phase clock input terminal of the $2k$th sampling circuit.

* * * * *